United States Patent
Ogasawara (10) Patent No.: US 8,187,980 B2
(45) Date of Patent: May 29, 2012

(54) ETCHING METHOD, ETCHING APPARATUS AND STORAGE MEDIUM

(75) Inventor: Kosuke Ogasawara, Sendai (JP)

(73) Assignee: Tokyo Electron Limited, Tokyo (JP)

( * ) Notice: Subject to any disclaimer, the term of this patent is extended or adjusted under 35 U.S.C. 154(b) by 1157 days.

(21) Appl. No.: 12/021,452

(22) Filed: Jan. 29, 2008

(65) Prior Publication Data

US 2008/0188086 A1  Aug. 7, 2008

Related U.S. Application Data (60) Provisional application No. 60/912,842, filed on Apr. 19, 2007.

(30) Foreign Application Priority Data

Feb. 2, 2007 (JP) .................. 2007-024533

(51) Int. Cl.
*H01L 21/302* (2006.01)
(52) U.S. Cl. ........ 438/719; 438/706; 438/714; 438/723; 430/313
(58) Field of Classification Search .................. 438/706, 438/710, 712, 714, 723, 719; 156/345.47; 430/310, 312, 313
See application file for complete search history.

(56) References Cited

U.S. PATENT DOCUMENTS

| 4,376,672 | A  | * | 3/1983 | Wang et al. | 438/713 |
| 6,432,832 | B1 | * | 8/2002 | Miller et al. | 438/713 |
| 2005/0106493 | A1 | * | 5/2005 | Ho et al. | 430/270.1 |
| 2006/0014360 | A1 | * | 1/2006 | Matsumoto | 438/424 |
| 2007/0184354 | A1 | * | 8/2007 | Chandrachood et al. | 430/5 |

FOREIGN PATENT DOCUMENTS

| JP | 10-70104 | 3/1998 |
| JP | 2000-150632 | 5/2000 |
| JP | 2003-511857 | 3/2003 |

OTHER PUBLICATIONS

Japanese Office Action issued Apr. 5, 2011, in Patent Application No. 2007-024533 (with English-language translation).

* cited by examiner

*Primary Examiner* — Lan Vinh
(74) *Attorney, Agent, or Firm* — Oblon, Spivak, McClelland, Maier & Neustadt, L.L.P.

(57) ABSTRACT

An etching method for forming a groove by etching a silicon layer of a substrate by using a mask which has a first region where an opening with a first opening width is formed and a second region where an opening with a second opening width larger than the first opening width is formed, the method includes: mounting the substrate on a mounting table in a processing chamber; converting a processing gas containing $Cl_2$ gas, HBr gas, and one of CO gas and $CO_2$ gas into a plasma; and etching the silicon layer by the plasma.

5 Claims, 9 Drawing Sheets

ETCHING METHOD, ETCHING APPARATUS AND STORAGE MEDIUM

FIELD OF THE INVENTION

The present invention relates to a technique for plasma etching a single crystalline silicon layer or a polycrystalline silicon layer.

BACKGROUND OF THE INVENTION

In manufacturing semiconductor devices, there is a plasma etching process of a silicon layer. To be specific, there is an etching process for etching single crystalline silicon to form a groove for burying an oxide film serving as a device isolation film or an etching process for etching polysilicon, i.e. polycrystalline silicon, to form a recess for embedding the oxide film while leaving a gate electrode.

Figure 7A:
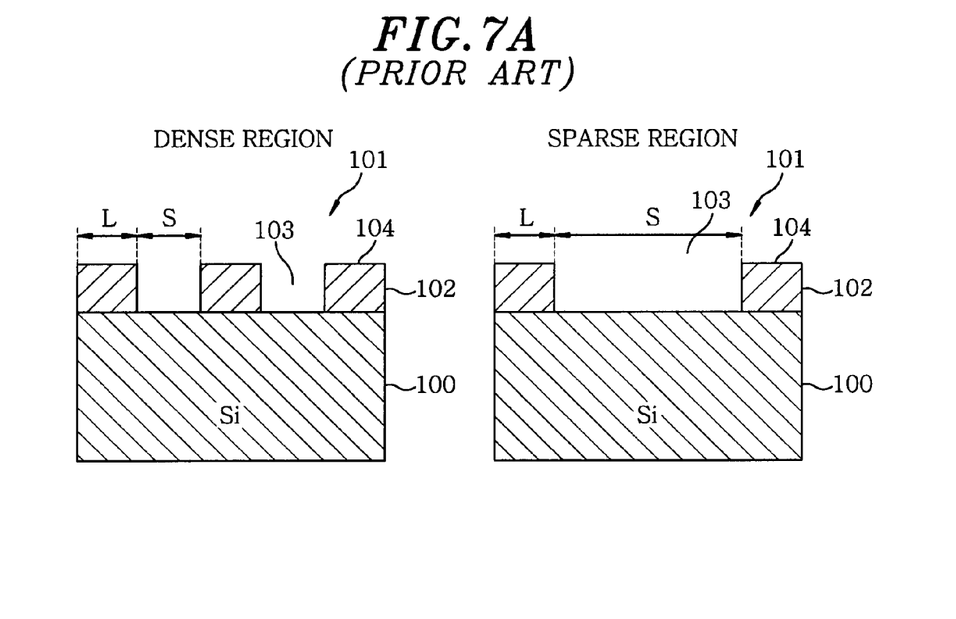
FIGS. 7A to 7C are cross sectional views of a substrate used in a conventional etching process.
Figure 7B:
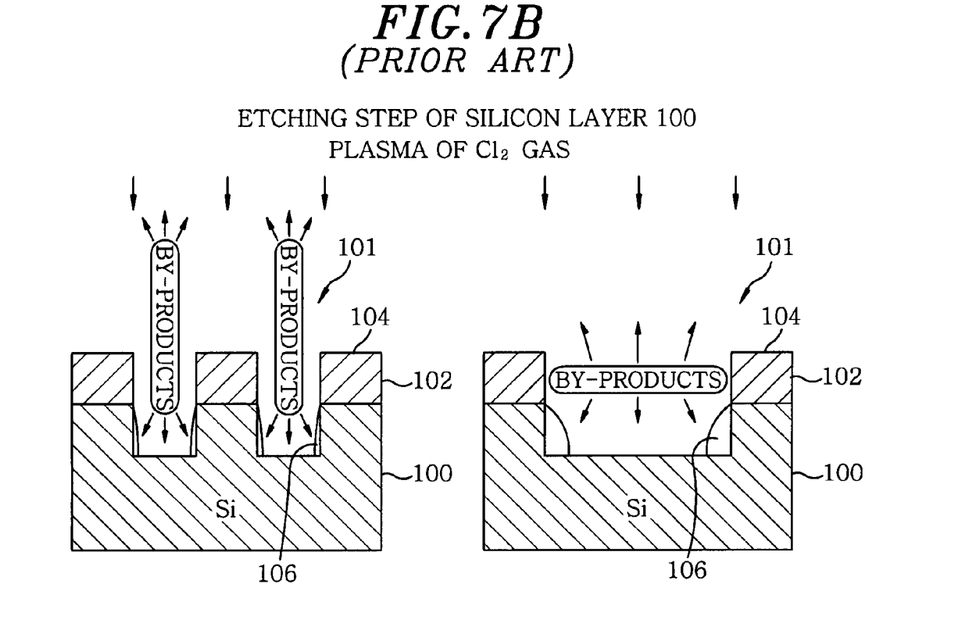
Figure 7C:
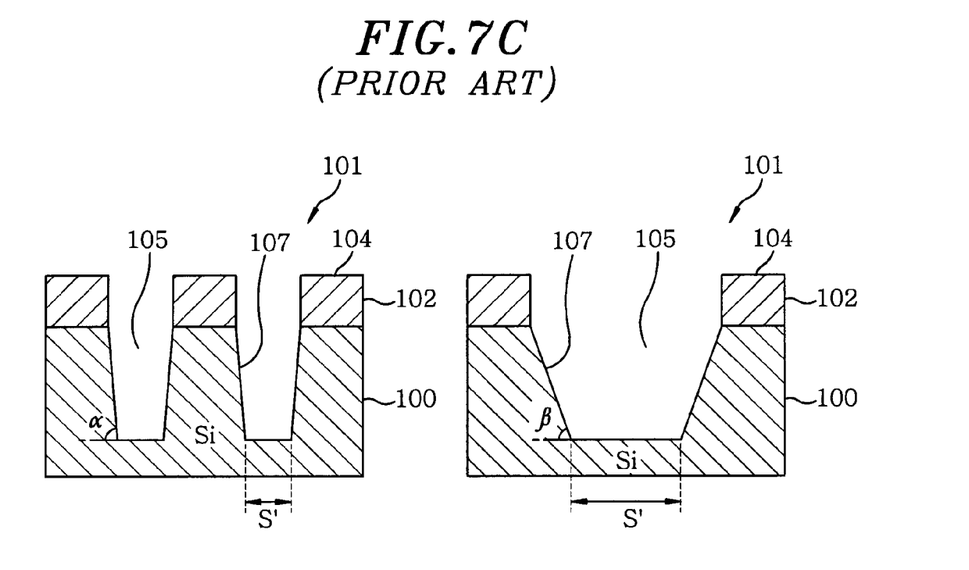

FIGS. 7A to 7C illustrate a process of forming a groove-like space 105, i.e. a recess for burying a device isolation film in a silicon layer 100 of a substrate 101. The silicon layer 100 is etched through a hard mask 102 made of silicon nitride. As shown in FIG. 7A, the hard mask 102 has groove-type openings 103 whose dimension is S and protruded portions 104 between adjacent openings 103 whose dimension is L. Further, the hard mask 102 of the same substrate 101 has a dense pattern region where the dimension S is small and the neighboring protruded portions 104 are densely arranged and a sparse pattern region where the dimension S is large and the neighboring protruded portions 104 are spaced apart from each other.

If the substrate 101 is etched by using a processing gas, e.g., $Cl_2$ gas, by-products containing, e.g., silicon and chlorine are generated. Some of the by-products are vaporized and discharged from the openings 103, but the rest of them are deposited as deposits 106 on the sidewall indicated as lines 107 between the spaces 105, as shown in FIG. 7B. Since the dimension of the lines 107 is getting larger due to this, the dimension S' of the spaces 105 after the etching process becomes smaller than the dimension S of the openings 103 formed through the hard mask 102, as shown in FIG. 7C.

Meanwhile, if the hard mask 102 has the dense and sparse pattern regions of the protruded portions 104 as described above, the volume of one single recess (opening) 103 in the sparse pattern region is larger than that in the dense pattern region. Therefore, more by-products are generated in a single recess of the sparse pattern region than in a single recess of the dense pattern region. Further, since the amount of the deposits 106 increase as the amount of the by-products increase, the amounts of the deposits 106 in the sparse pattern region are larger than those in the dense region.

Figure 8:
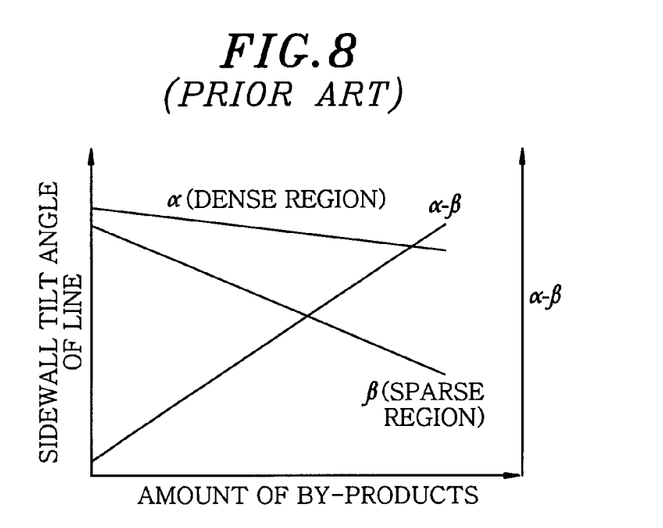
FIG. 8 shows a characteristic graph showing a correlation between the amounts of by-products and the sidewall tilt angles in the etching process.

As a result, the sidewall tilt angle β of the lines 107 in the sparse pattern region is smaller than the sidewall tilt angle α of the lines 107 in the dense pattern region, as shown in FIG. 7C. As the difference of the dimensions S of the openings 103 in the dense and sparse pattern regions increases, the amount of the difference of the generated by-products becomes larger, which results in the increase of the difference between the sidewall tilt angles α and β of the lines 107. Furthermore, since the deposits 106 are more easily deposited in the sparse pattern region than in the dense pattern region, if the amounts of the by-products increase, the difference between the sidewall tilt angles α and β of the lines 107 in the dense and sparse pattern regions increases, as shown in FIG. 8.

If the sidewall tilt angles α and β of the lines 107 after the etching process in the dense and sparse pattern regions are unbalanced as mentioned above, and then for example, if the hard mask 102 is removed and an oxide film is embedded in the space 105, burying properties (filling rate) of the oxide film in the space 105 of the oxide film cannot be uniform. Moreover, if the filling rate of the oxide film is not uniform, electrical characteristics such as oxide film withstanding voltage characteristics may also not be uniform in surface. Therefore, it is required to make the sidewall tilt angles α and β of the lines 107 in the dense and sparse pattern regions equal to each other.

Conventionally, the etching process is performed under the processing conditions controlled such that the deposits 106 are prevented to be deposited on the sidewall of the lines 107 or the deposits 106 are to be removed. That is, the processing conditions are adjusted so that the sidewall tilt angles α and β of the lines 107 are very large (close to 90°) and thereby the difference between the sidewall tilt angles α and β of the lines 107 in the dense and sparse pattern regions becomes small.

However, since it is preferable that the sidewall tilt angles α and β of the lines 107 are small, i.e. reclined, for the enhancement of the burying properties of the oxide film described above, it is required to make the sidewall tilt angles α and β in the dense and sparse pattern regions equal to each other and at the same time to make the tilt angles α and β small. Furthermore, techniques for freely controlling the sidewall tilt angles α and β of the lines 107 are also required.

Japanese Patent Laid-open Application No. 1996-115900 (paragraphs [0021] and [0022]) discloses a technique for etching a silicon-based layer into a groove shape by using $Cl_2$ gas and CO gas, but the difference in shape of grooves or the tilt angles of the lines 107 in the dense and sparse pattern regions are not considered.

SUMMARY OF THE INVENTION

In view of the above, the present invention provides a technique capable of making sidewall tilt angles of protruded portions between openings small and making the sidewall tilt angles become equal in surface when forming grooves by etching a single crystalline silicon layer or a polycrystalline silicon layer through a mask where openings have different opening widths.

In accordance with a first aspect of the present invention, there is provided an etching method for forming a groove by etching a silicon layer of a substrate by using a mask which has a first region where an opening with a first opening width is formed and a second region where an opening with a second opening width larger than the first opening width is formed, the method including: mounting the substrate on a mounting table in a processing chamber; converting a processing gas containing $Cl_2$ gas, HBr gas, and one of CO gas and CO2 gas into a plasma; and etching the silicon layer by the plasma.

Preferably, protruded portions between grooves are densely arranged in the first region and are less densely arranged in the second region than in the first region.

The mask may be formed of a silicon nitride film.

Further, the mask also may be patterned such that a ratio of the second opening width to the first opening width is about 6 or more.

Preferably, etching the silicon layer is performed by converting the processing gas into the plasma by supplying high frequency power between an upper electrode which is disposed above the substrate to face it and a lower electrode serving as a part of the mounting table.

In accordance with a second aspect of the present invention, there is provided an etching apparatus for forming a groove by etching a silicon layer of a substrate by using a mask which has a first region where an opening with a first opening width is formed and a second region where an opening with a second opening width larger than the first opening width is formed, the apparatus including: a mounting table disposed at a lower portion of a processing chamber; a gas supply line for supplying a processing gas containing $Cl_2$ gas, HBr gas, and one of CO gas and $CO_2$ gas to the processing chamber; and a plasma generator for converting the processing gas into a plasma.

Preferably, the plasma generator includes an upper electrode which is disposed above the substrate to face it and a lower electrode serving as part of the mounting table.

In accordance with a third aspect of the present invention, there is provided a storage medium storing therein a computer program executable on a computer, the computer program being used in an etching apparatus for forming a groove by etching a silicon layer of a substrate by using a mask which has a first region where an opening with a first opening width is formed and a second region where an opening with a second opening width larger than the first opening width is formed, wherein the computer program is configured to execute the etching method described above.

In accordance with the present invention, in case of forming grooves by etching the single crystalline silicon layer or a polycrystalline silicon layer through a mask where the opening widths of the openings are different, the etching process is performed by using the processing gas containing a gas selected from $Cl_2$ gas, HBr gas, CO gas and $CO_2$ gas. Therefore, plasma containing carbon increases, whereby the difference in amounts of the deposits caused by the different opening widths of the openings of the mask is relatively reduced. Accordingly, the sidewall tilt angles of the protruded portions between openings become smaller, and further, they can be uniform in surface of the substrate. Furthermore, the sidewall tilt angles of the protruded portions can be freely controlled by adjusting the amount of the carbon plasma by changing the flow rate of CO gas or $CO_2$ gas.

BRIEF DESCRIPTION OF THE DRAWINGS

The objects and features of the present invention will become apparent from the following description of embodiments given in conjunction with the accompanying drawings, in which.

DETAILED DESCRIPTION OF THE EMBODIMENTS

Hereinafter, embodiments of the present invention will be described in detail with reference to the accompanying drawings which form a part hereof.

Figure 1A:
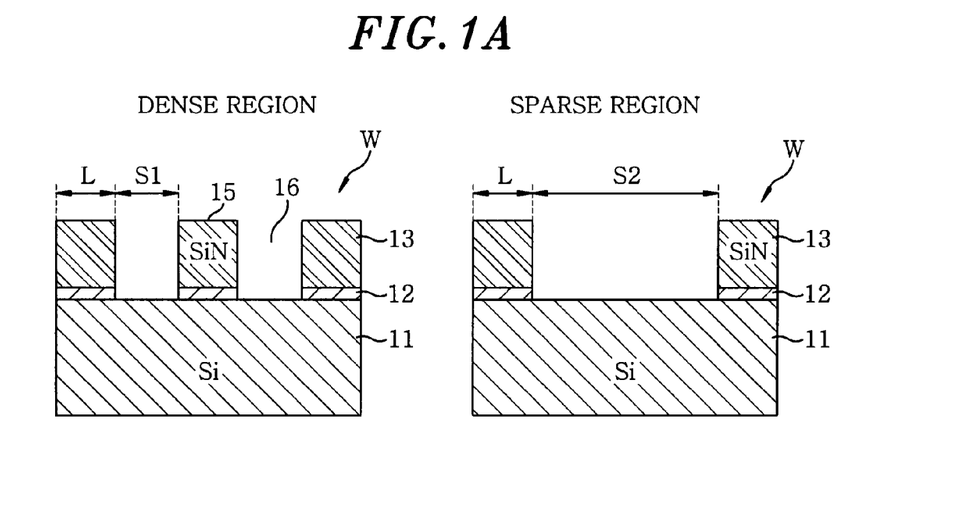
FIGS. 1A to 1C show cross sectional views of an exemplary wafer W used in an etching process in accordance with the present invention.
Figure 1B:
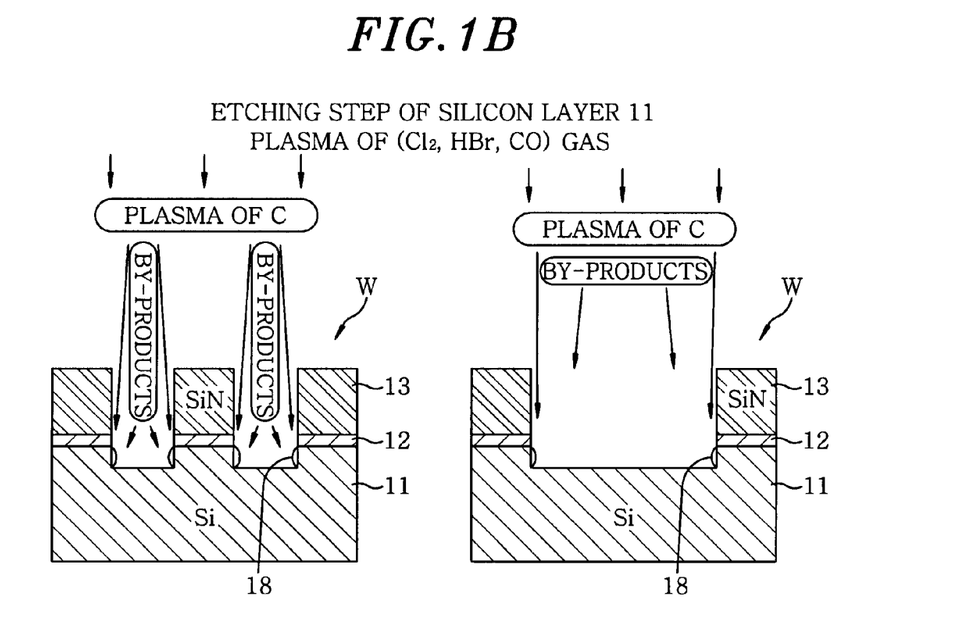
Figure 1C:
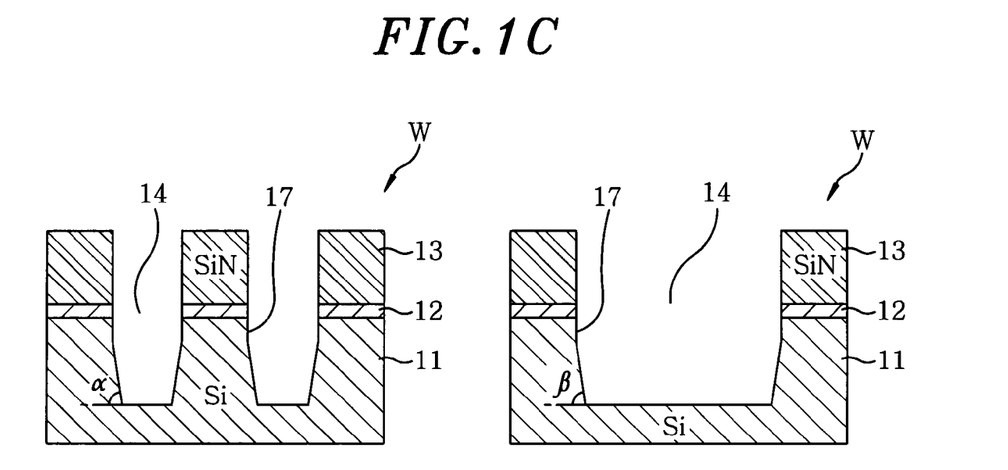

An exemplary semiconductor substrate (hereinafter, referred to as a "wafer W") on which an etching method of the present invention is applied will be described with reference to FIGS. 1A to 1C. On a silicon layer 11 of the wafer W shown in FIG. 1A, an oxide film 12 of a thickness of, e.g., 10 nm and a SiN (silicon nitride) film 13 of a thickness of, e.g., 100 nm, are formed in that order from the bottom side. Further, the oxide film 12 and the SiN film 13 are provided with protruded portions 15 and groove-type openings 16, so that patterns having spaces 14 and lines 17 can be formed in the silicon layer 11 by using the oxide film 12 and the SiN film 13 as a hard mask.

Furthermore, the oxide film 12 and the SiN film 13 in the same wafer W are provided with a first region, i.e. a dense pattern region in which the dimension of an opening 16 is as small as the first opening width S1 so that the distance between the protruded portions 15 is small and the protruded portions 15 are densely arranged, and a second region, i.e. a sparse pattern region in which the dimension of an opening 16 is as wide as the second opening width S2 so that the distance between the protruded portions 15 is large and the protruded portions 15 are sparsely arranged. For example, the first opening width S1 and the second opening width S2 are respectively 160 nm and 1100 nm. Further, the dimensions L of the protruded portions 15 in the dense and sparse pattern regions are respectively 100 nm and 110 nm. The wafer W is etched in the following manner by an etching apparatus 51, which will be described later, to form the space 14 for burying an oxide film for device isolation as a part of an STI process.

Etching of Silicon Layer 11

As a processing gas for the wafer W, e.g., $Cl_2$ gas, HBr gas and CO gas are supplied, e.g., at flow rates of 65, 35 and 20 sccm, respectively. Subsequently, the processing gas is converted into plasma, which will be described later. By supplying the plasma to the wafer W, the silicon layer 11 is etched by using the oxide film 12 and the SiN film 13 as a mask. At that time, since the opening widths S1 and S2 of the openings 16 in the dense and sparse pattern regions are different from each other, the etching amount of the silicon layer 11 in each opening 16 is different. In other words, since the etching amount in the sparse pattern region is larger than that in the dense pattern region, the amounts of by-products generated in the sparse pattern region are larger than those in the dense pattern region.

Besides, by supplying CO gas as a part of the processing gas, carbon plasma increases so that the amount of difference between the by-products generated in the dense and sparse pattern regions can be ignorable. Therefore, as shown in FIG. 1B, the amounts of the deposits 18 deposited on the sidewalls of the lines 17 in the dense and sparse pattern regions are almost same. Consequently, as the etching of the silicon layer 11 is being performed, the spaces 14 in the dense and sparse pattern regions are formed to have dimensions slightly smaller than the opening widths S1 and S2, respectively. That is, the etching is carried out so that angles between the sidewalls of the lines 17 and a horizontal plane (tilt angles) can be specific angles α and β. As described above, since almost same amounts of deposits 18 are deposited on the sidewalls of the lines 17 in the dense and sparse pattern regions, the tilt angles α and β of the lines 17 are substantially the same as those shown in FIG. 1C. Moreover, the spaces 14 having a desired depth of, e.g., 250 nm are formed. Thereafter, the oxide film 12 and the SiN film 13 are removed and an oxide film for device isolation is buried in the spaces 14.

Etching Apparatus

Figure 2:
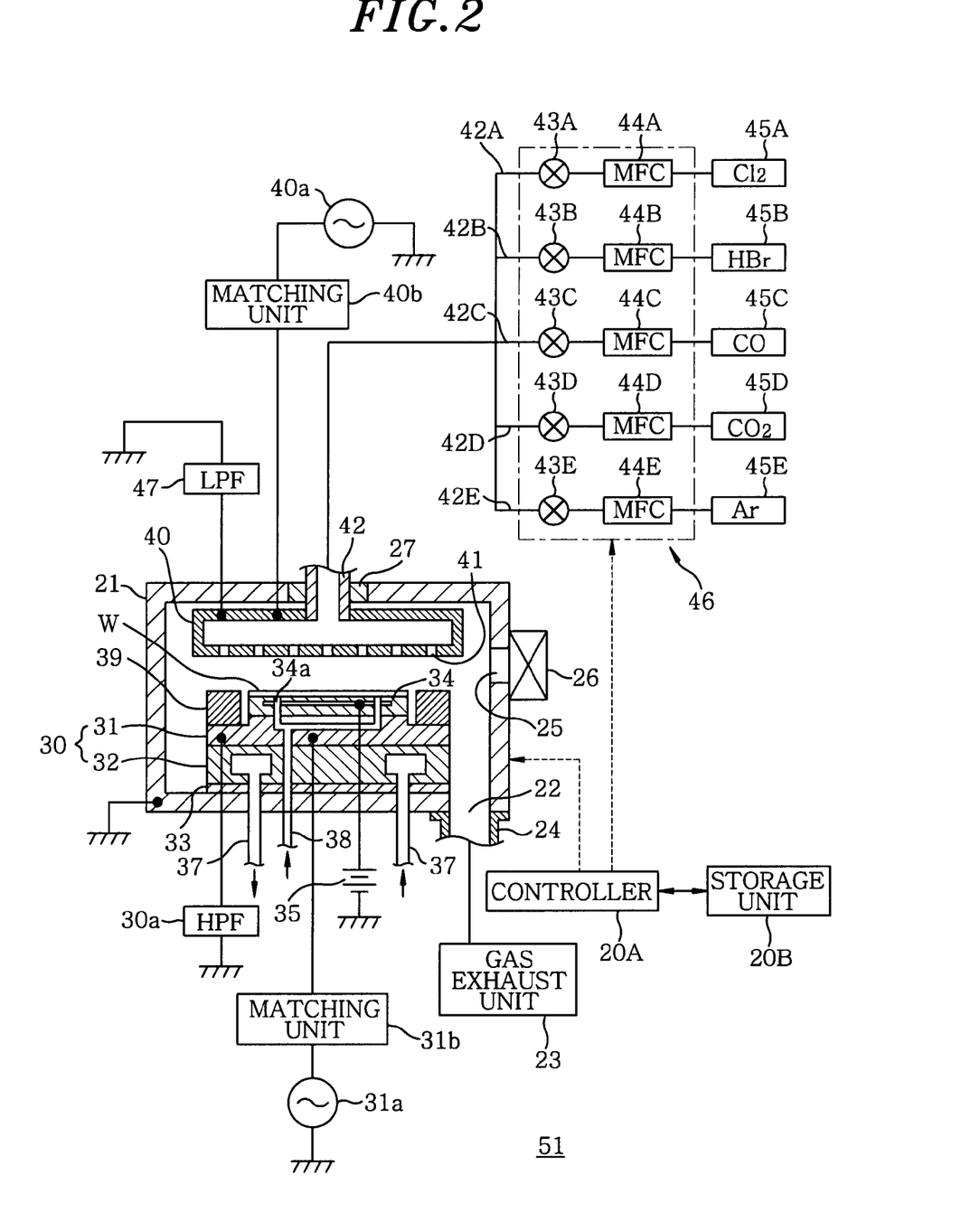
FIG. 2 shows a longitudinal cross sectional view of an exemplary etching apparatus used in the etching process.

Hereinafter, an example of an etching apparatus 51 used in the etching process will be described with reference to FIG. 2.

The etching apparatus 51 includes a processing chamber 21 formed of a vacuum chamber, a mounting table 30 disposed at a lower central portion in the processing chamber 21 and an upper electrode 40 provided above the processing chamber 21. A gas exhaust unit 23 including a vacuum pump or the like is connected to a gas exhaust port 22 formed in the bottom surface of the processing chamber 21 via a gas exhaust line 24. Formed through a sidewall of the processing chamber 21 is a transfer opening 25 for a wafer W, which is closed and opened by a gate valve 26. The processing chamber 21 is grounded.

The mounting table 30 includes a lower electrode 31 and a supporting body 32 supporting the lower electrode 31 from the bottom, and it is disposed on a bottom portion of the processing chamber 21 via an insulation member 33. An electrostatic chuck 34 is provided on the mounting table 30, and the wafer W is electrostatically attracted to be adsorbed to the mounting table 30 by a voltage applied to the electrostatic chuck 34 from a high voltage DC power supply 35. Formed in the mounting table 30 is a temperature control medium path 37 through which a specified temperature control medium flows, the wafer W being controlled to be maintained at a desired temperature by the temperature control medium. Further, formed in the mounting table 30 is a gas channel 38 for supplying thermally conductive gas such as He gas or the like as the backside gas. The gas channel 38 is opened at plural locations on the top surface of the mounting table 30. These opening portions communicate with through-holes 34a formed in the electrostatic chuck 34.

The lower electrode 31 is grounded via a high pass filter (HPF) 30a, while a high frequency power supply 31a of, e.g., 13.56 MHz is connected to the lower electrode 31 via a matching unit 31b. Furthermore, a focus ring 39 is disposed on an outer peripheral portion of the lower electrode 31 to surround the electrostatic chuck 34, so that the plasma generated is to be converged toward the wafer W on the mounting table 30 through the focus ring 39.

The upper electrode 40 has a hollow shape and a plurality of holes 41 through which the processing gas is dispersedly supplied into the processing chamber 21 is uniformly formed at the bottom surface of the upper electrode 40, which forms a gas shower head. Further, a gas introduction line 42 serving as a gas supply line is connected to a central portion of the top surface of the upper electrode 40, while it passes through the central portion of the upper wall of the processing chamber 21 via an insulation member 27.

Further, the upstream side of the gas introduction line 42 is divided into five branch lines 42A to 42E, ends of which are respectively connected to gas supply sources 45A to 45E via valves 43A to 43E and mass flow controllers 44A to 44E. The valves 43A to 43E and the mass flow controllers (MFCs) 44A to 44E form a gas supply system 46. Furthermore, the upper electrode 40 is grounded via a low pass filter (LPF) 47, while it is connected to a high frequency power supply 40a with a frequency of, e.g., 60 MHz higher than that of the high frequency power supply 31a via a matching unit 40b.

The high frequency power from the high frequency power supply 40a coupled to the upper electrode 40 is to convert the processing gas into plasma. The high frequency power from the high frequency power supply 31a coupled to the lower electrode 31 is to apply a bias power to the wafer W and to attract ions in the plasma to the surface of the wafer W. The upper electrode 40 and the lower electrode 31 serve as a plasma generator.

Further, the etching apparatus 51 includes a controller 20A formed of, e.g., a computer, the controller 20A having a data processing unit formed of a program, a memory and a CPU. The program has commands representing processing or transfer of the wafer W by which the controller 20A sends control signals to each part of the etching apparatus 51 to perform a corresponding step which will be described later. Furthermore, the memory is provided with areas where processing parameters such as processing pressure, processing time, a gas flow rate, power and the like are recorded.

Therefore, if the CPU executes the commands of the program, the processing parameters are read out and control signals corresponding to the parameters are transmitted to respective parts of the etching apparatus 51. The program, which includes a program related to input manipulation or display of the processing parameters, is stored in a computer-readable storage medium 20B such as a flexible disc, a compact disc, a MO (magneto-optical disc), a hard disc and the like and is installed in the controller 20A.

Hereinafter, there will be described an etching method using the etching apparatus 51 described above. First, a wafer W is horizontally mounted on the mounting table 30 in the processing chamber 21 by a substrate transfer mechanism (not shown) and the gate valve 26 is closed thereafter. Subsequently, the backside gas is supplied from the gas channel 38 so that the wafer W is set to be maintained at a predetermined temperature.

After that, the gas exhaust unit 23 evacuates the inside of the processing chamber 21 through the gas exhaust line 24 to maintain the pressure in the processing chamber 21 at 3.3 Pa (25 mTorr), and $Cl_2$ gas, HBr gas and CO gas serving as the processing gas are supplied from the gas supply system 46 at gas flow rates of 65 sccm, 35 sccm and 20 sccm, respectively. Subsequently, the high frequency power with a frequency of 60 MHz and a power of, e.g., 500 W is applied to the upper electrode 40 to convert the processing gas into plasma. At the same time, the high frequency power with a frequency of 13.56 MHz and a power of, e.g., 200 W as the bias power is applied to the lower electrode 31. The silicon layer 11 is etched by the generated plasma, as described above.

If the silicon layer 11 is etched by $Cl_2$ gas and HBr gas, the opening width S2 of the openings 16 in the sparse pattern region is larger than the opening width S1 of the openings 16 in the dense pattern region and the amount of by-products generated in the sparse pattern region is larger than those generated in the dense pattern region. However, in accordance with the embodiment described above, since CO gas containing carbon is supplied to form the plasma including carbon, the carbon plasma is generated and the amount thereof is increased so much that the difference between the amounts of the generated by-products can be ignorable. Accordingly, almost the same amounts of deposits 18 are deposited on the sidewalls of the lines 17 in the dense and sparse pattern regions, so that the sidewall tilt angles α and β of the lines 17 can be small and substantially identical.

Moreover, the amounts of the deposits 18 can be adjusted by adjusting the amount of the carbon plasma by changing the flow rate of CO gas, whereby the sidewall tilt angles α and β of the lines 17 in the dense and sparse pattern regions can be matched to each other, and further the sidewall tilt angles α and β in surface of the wafer W can be freely adjusted.

Furthermore, since $Cl_2$ gas and HBr gas are used together to etch silicon, the process characteristics such as an etching rate can be precisely controlled. To be specific, although $Cl_2$ gas as well as HBr gas can be used to etch the silicon, reaction product of $Cl_2$ gas generated by the etching has a low vapor pressure and therefore the etching rate thereof is higher than that of HBr gas. For this reason, using HBr gas and $Cl_2$ gas which have different etching rates and controlling respective flow rates (partial pressure) thereof make precise control of the process easier than individually using each gas.

Furthermore, while the etching method of the present invention is applied to the process for forming the spaces 14 in the silicon layer 11 through the mask where the opening widths S1 and S2 of the openings 16 are different, it is highly effective if the difference between the opening widths S1 and S2 is large, for example, if a ratio of the opening width S2 in the sparse pattern region to the opening width S1 in the dense pattern region is 6 or more. To be more specific, a lot of deposits 18 are needed to make the tilt angles α and β small (reclined). However, if there is a large difference between the opening widths S1 and S2, the difference between the amounts of the deposits 18 in the dense pattern region and in the sparse pattern region is significantly large according to the conventional method, as described with reference to FIG. 8, thereby making it impossible to form a space 14 where the difference of the tilt angles α and β is small.

On the contrary, in accordance with the present invention, the amounts of the deposits 18 can be controlled to be nearly uniform in surface of the wafer W by increasing the amount of the carbon plasma. Therefore, even in case of the wafer W where there is a large difference between the opening widths S1 and S2, it is possible to etch the wafer W such that the sidewall tilt angles α and β of the lines 17 are nearly the same. Moreover, since the amount of the carbon plasma can be increased by controlling the flow rates of CO gas or $CO_2$ gas such that the difference of the amounts of the by-products generated corresponding to the difference of the opening widths S1 and S2 of the openings 16 is ignorable, the etching method of the present invention can be applied to any wafer W regardless of the above ratio.

Although the above embodiment has been described with the single crystalline silicon layer 11, the etching method of the present invention may be applied to polycrystalline silicon, as will be described in the following example. As for the processing gas, $CO_2$ gas may be used instead of CO gas, as will be described in the following example. Further, dilution gas such as nitrogen gas or argon gas may be supplied along with the above gas as the processing gas, and oxygen gas may also be supplied.

EXAMPLES

Example 1

Next, an experiment of the etching method in accordance with the present invention will be described. In the experiment, the silicon layer 11 of the wafer W shown in FIG. 1 was etched by the etching apparatus 51 under the following conditions in order to confirm the influence of the flow rate of CO gas. Thereafter, the wafer W was cut, and the sidewall tilt angles α and β of the lines 17 in the dense and sparse pattern regions were measured. Further, by measuring the depth of the spaces 14, an etching rate and micro-loading indicated as a ratio of the depth of the space 14 in the sparse region to the depth of the space 14 in the dense region were calculated. Further, the etching rate was derived from an average of etching rates in the dense and sparse pattern regions.

[Processing Conditions]
Processing pressure: 3.3 Pa (25 mTorr)
Frequency of the high frequency power of the upper electrode 40: 60 MHz
Power of the upper electrode 40: 500 W
Frequency of the high frequency power of the lower electrode 31: 13.56 MHz
Power of the lower electrode 31: 200 W Example 1-1

Processing gas: $Cl_2$/HBr/CO=65/35/10 sccm

Example 1-2

Processing gas: $Cl_2$/HBr/CO=65/35/20 sccm

Comparative Example 1

Processing gas: $Cl_2$/HBr=65/35 sccm
Experimental Result

Figure 3A:
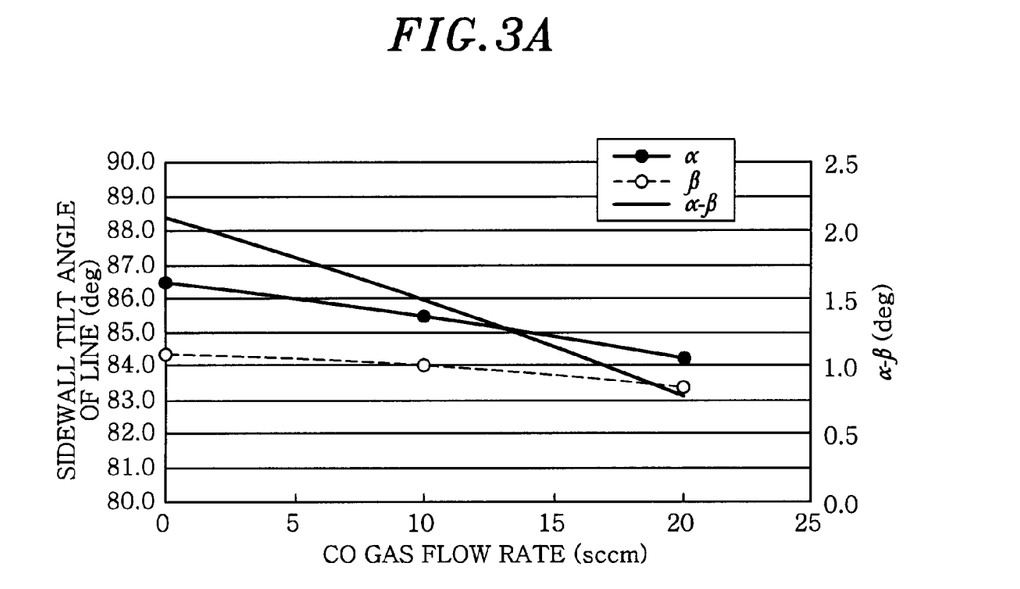
FIGS. 3A and 3B are characteristic graphs showing results in accordance with an embodiment of the present invention.

As shown in FIG. 3A, it is noted that the sidewall tilt angles α and β of the lines 17 in the dense and sparse pattern regions are becoming equal to each other as the flow rate of CO gas increases. Furthermore, it is also noted that the sidewalls of the lines 17 are not close to the direction perpendicular to the surface plane, i.e. the tilt angles α and β are not close to 90°, but they are close to the surface plane, i.e. the tilt angles α and β become small.

Figure 3B:
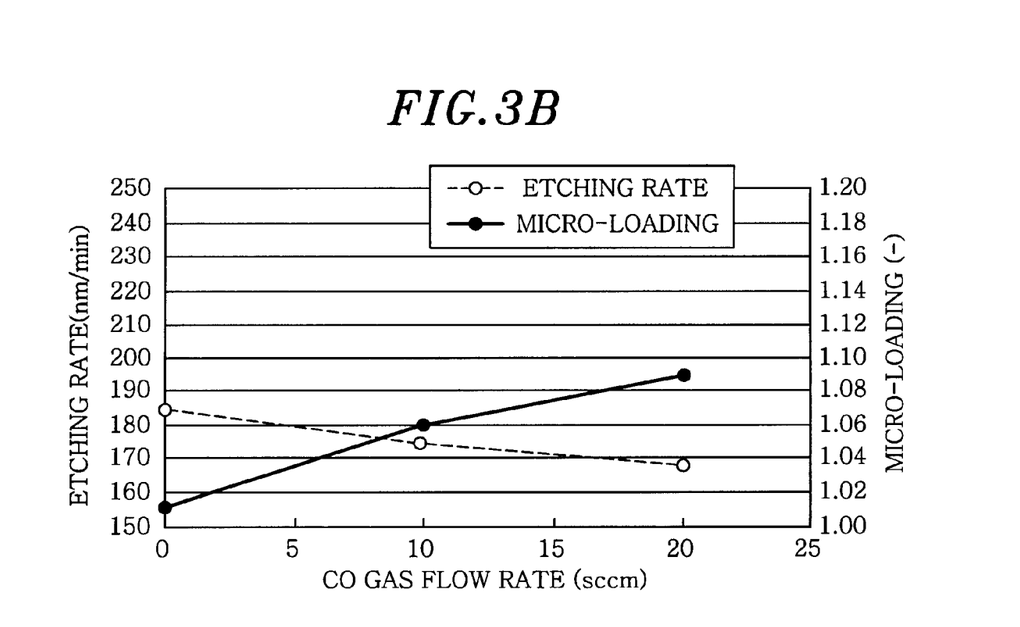

On the other hand, the etching rate and the micro-loading are degraded by the addition of CO gas, as shown in FIG. 3B. That is, by adding CO gas, the etching rate slightly decreases and the micro-loading slightly increases, i.e. the depth of the space 14 in the dense pattern region is reduced. The reason for this is probably that the amount of the carbon plasma increases by the addition of CO gas so that the deposits 18 on the bottom surface of the space 14 increase, as described above. That is, since the opening width S1 of the openings 16 in the dense pattern region is narrow, by-products gene N by the etching are hardly discharged outside, and therefore they seem to become the deposits 18. However, such a side effect caused by the addition of CO gas is immaterial since the added amount thereof is only about 10% or less in the experiment.

Example 2

The same experiment as that of the example 1 was carried out under the following conditions except that $CO_2$ gas was used instead of CO gas. Further, any description on the same conditions as those in the example 1 will be omitted here.

Example 2-1

Processing gas: $Cl_2$/HBr/$CO_2$=65/35/20 sccm

Example 2-2

Processing gas: $Cl_2$/HBr/$CO_2$=65/35/40 sccm

Comparative Example 2

Processing gas: $Cl_2$/HBr=65/35 sccm
Experimental Result

Figure 4:
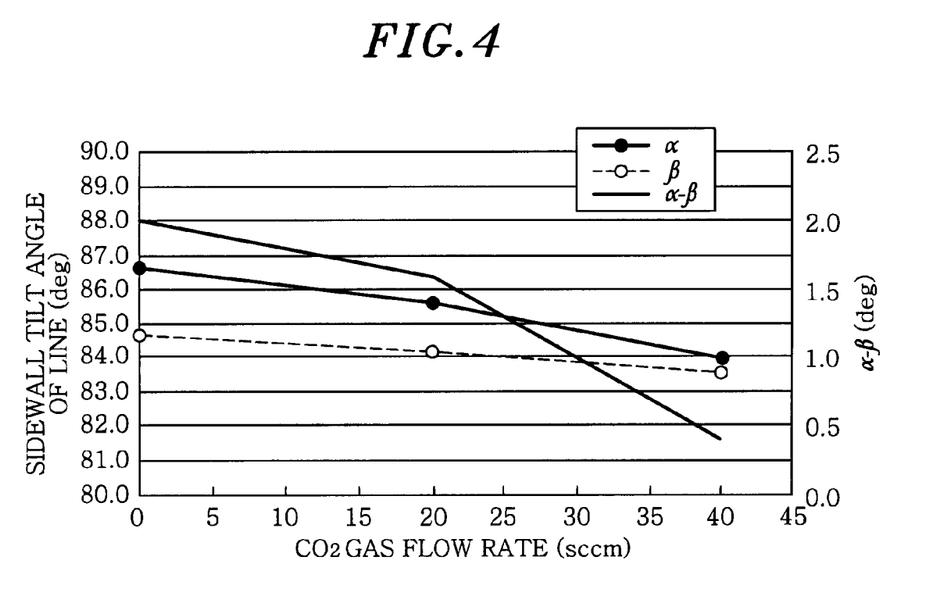
FIG. 4 is a characteristic graph showing results in accordance with the embodiment of the present invention.

As shown in FIG. 4, the result of this experiment is the same as the result of the example 1. Although the results of the etching rate and the micro-loading are not shown, the degradation in this experiment was only 10% even if the flow rate of $CO_2$ was up to 40 sccm. That is, in this experiment, the flow rate of $CO_2$ gas was able to be increased up to twice that of CO gas in example 1, which resulted in that the absolute values of the tilt angles α and β in the dense and sparse pattern regions became further decreased. It is considered most likely due to the influence of plasma containing oxygen after $CO_2$ gas is converted into plasma.

Example 3

While the above examples have been described with the single crystalline silicon layer in the STI process, the etching method of the polycrystalline silicon for forming the gate electrode will be described hereinafter.

Figure 5:
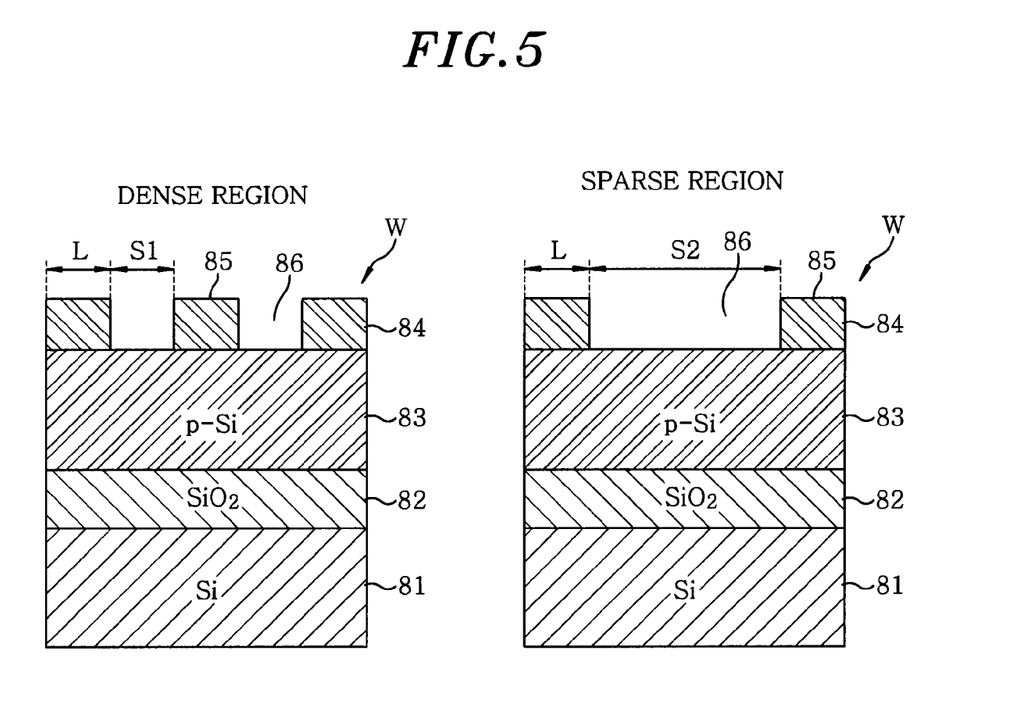
FIG. 5 is a cross sectional view of a wafer W used in the embodiment of the present invention.

A wafer W used in this experiment is described with reference to FIG. 5. The wafer W was of a structure in which an oxide film 82 serving as a gate oxide film, a polycrystalline silicon film 83, a resist film 84 formed of, e.g., tetra ethyl ortho silicate (TEOS) were formed on a silicon layer 81 in that order from the bottom side. The resist film 84 was provided with protruded portions 85 and openings 86. Further, as described with reference to the wafer W shown in FIG. 1, there were formed the first region, i.e. a dense pattern region in which the opening width S1 of the openings 86 was narrow and the protruded portions 85 were densely arranged and the second region, i.e. a sparse pattern region in which the opening width S2 of the openings 86 was wide. Furthermore, the pattern was formed such that the dimension L of the protruded portions 85 was 100 nm and the opening widths S1 and S2 in the dense and sparse pattern regions were respectively 160 nm and 1100 nm. On the other hand, in case of a product wafer W, the polycrystalline silicon film 83 would be doped with P (phosphorus) or B (boron). Herein, an experimental wafer W which was not doped was used. A space (corresponding to 14 in FIG. 1C) was formed under the same conditions as those of the example 1 except for the following conditions.

[Processing Conditions]
Processing pressure: 4.0 Pa (30 mTorr)
Power of the upper electrode 40: 600 W
Power of the lower electrode 31: 100 W

Example 3-1

Processing gas: $Cl_2$/HBr/CO=500/100/10 sccm

Example 3-2

Processing gas: $Cl_2$/HBr/CO=500/100/20 sccm

Comparative Example 3

Processing gas: $Cl_2$/HBr=500/100 sccm
Experimental Result

Figure 6:
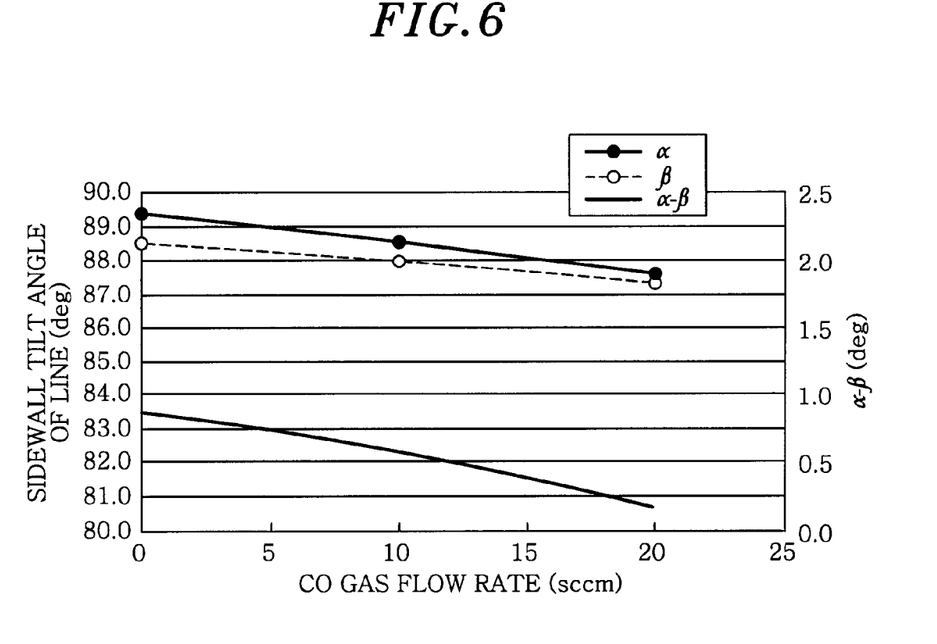
FIG. 6 is a characteristic graph showing results in accordance with the embodiment of the present invention.

As shown in FIG. 6, the result of processing the wafer W by adding CO gas is the same as those of the above examples. Further, the etching rate and the micro-loading are also immaterial. The data obtained by the above experiments are shown in the following Table 1.

Example 4

Preliminary experiments were performed before the above experiments in order to check whether the effect of the etching method of the present invention could be obtained by changing the processing conditions and, hereinafter, the results thereof would be described. The preliminary experiments were performed on the wafer W shown in FIG. 1 with the intention that the tilt angles α and β of the lines 17 in the dense and sparse pattern regions were substantially identical and further the tilt angles α and β were reclined, i.e. smaller. The detailed experimental conditions are omitted. The result is shown in Table 2.

TABLE 2

|  | Absolute values of the tilt angles | Difference between the tilt angles α and β |
|---|---|---|
| Processing pressure | X | X |
| Power of the lower electrode 31 | ○ | X |
| Flow rate ratio of $Cl_2$ gas | X | X |
| Flow rate of $O_2$ gas | ○ | X |
| Total gas flow rate | X | ○ |
| Temperature of the wafer W | X | ○ |
| Addition of CO gas | ○ | ○ |

Table 2 shows the result obtained when each parameter was increased. O-sign in the column of the absolute values of the tilt angles indicates that the tilt angles α and β decreased, whereas O-sign in the column of the difference between the tilt angles α and β represents that the difference of the tilt angles α and β decreased. That is, O-sign indicates a desired result in any cases.

From the result, it has been found out that both columns cannot be improved at the same time by increasing any parameter. However, it is noted that, by adding CO gas, the tilt angles α and β in the dense and sparse pattern regions became substantially identical and the tilt angles α and β became smaller.

Meanwhile, from Table 2, it may be inferred that the same result as that of the present invention may be obtained by reducing the processing pressure or the flow rate ratio of $Cl_2$ gas. However, since the etching rate is also significantly lowered by doing so, it is not preferable.

While the invention has been shown and described with respect to the embodiments, it will be understood by those skilled in the art that various changes and modifications may be made without departing from the scope of the invention as defined in the following claims.

TABLE 1

|  |  | Example 1 CO flow rate (sccm) | | | Example 2 $CO_2$ flow rate (sccm) | | | Example 3 CO flow rate (sccm) | | |
|---|---|---|---|---|---|---|---|---|---|---|
|  |  | 0 | 10 | 20 | 0 | 20 | 40 | 0 | 10 | 20 |
| Angle of space 14(87) (deg) | α | 86.4 | 85.5 | 84.2 | 86.7 | 85.7 | 84 | 89.4 | 88.6 | 87.6 |
|  | β | 84.3 | 84 | 83.4 | 84.7 | 84.1 | 83.6 | 88.5 | 88 | 87.4 |
|  | α-β | 2.1 | 1.5 | 0.8 | 2 | 1.6 | 0.4 | 0.9 | 0.6 | 0.2 |
| Micro-loading |  | 1.01 | 1.06 | 1.09 |  |  |  |  |  |  |
| Etching rate (nm/min) |  | 183 | 174 | 168 |  |  |  |  |  |  |

What is claimed is:

1. An etching method for forming a groove by etching a silicon layer of a substrate by using a mask which has a first region where an opening with a first opening width is formed and a second region where an opening with a second opening width larger than the first opening width is formed, the method comprising:

mounting the substrate on a mounting table in a processing chamber;

converting a processing gas containing $Cl_2$ gas, HBr gas, and one of CO gas and $CO_2$ gas into a plasma; and etching the silicon layer by the plasma to thereby make substantially identical sidewall tilt angles of protruded portions between grooves in a first and a second etched region respectively corresponding to the first and the second region of the mask, wherein a flow rate of one of the CO gas and the $CO_2$ gas is controlled such that an added amount of micro-loading indicated as a ratio of a groove depth in the second etched region to that in the first etched region is about 10% or less compared with a case of using neither the CO gas nor the $CO_2$ gas, and wherein the mask is patterned such that a ratio of the second opening width to the first opening width is about 6 or more.

2. The etching method of claim 1, wherein protruded portions between grooves are densely arranged in the first region and are less densely arranged in the second region than in the first region.

3. The etching method of claim 1, wherein the mask is formed of a silicon nitride film.

4. The etching method of claim 1, wherein etching the silicon layer is performed by converting the processing gas into the plasma by supplying high frequency power between an upper electrode which is disposed above the substrate to face it and a lower electrode serving as a part of the mounting table.

5. The etching method of claim 1, wherein sidewall tilt angles of protruded portions between grooves in the etched silicon layer are controlled by adjusting an amount of carbon in the plasma by changing a flow rate of one of the CO gas and the $CO_2$ gas.

* * * * *